US011084524B2

(12) United States Patent
Fuji et al.

(10) Patent No.: US 11,084,524 B2
(45) Date of Patent: Aug. 10, 2021

(54) MOTOR CONTROL DEVICE

(71) Applicant: JTEKT CORPORATION, Osaka (JP)

(72) Inventors: Masashi Fuji, Toyota (JP); Satoru Mikamo, Okazaki (JP); Tomohiro Niwa, Okazaki (JP)

(73) Assignee: JTEKT CORPORATION, Osaka (JP)

( * ) Notice: Subject to any disclaimer, the term of this patent is extended or adjusted under 35 U.S.C. 154(b) by 92 days.

(21) Appl. No.: 16/668,622

(22) Filed: Oct. 30, 2019

(65) Prior Publication Data
US 2020/0140005 A1 May 7, 2020

(30) Foreign Application Priority Data

Nov. 5, 2018 (JP) .............................. JP2018-208146

(51) Int. Cl.
*G01D 18/00* (2006.01)
*B62D 5/04* (2006.01)
*G01R 31/50* (2020.01)

(52) U.S. Cl.
CPC ........... *B62D 5/0463* (2013.01); *G01R 31/50* (2020.01); *B62D 5/0487* (2013.01); *B62D 5/0493* (2013.01)

(58) Field of Classification Search
CPC .. B62D 5/0403; B62D 5/0463; B62D 5/0481; B62D 5/0487; B62D 5/0493; G01R 31/50; G05B 19/0421
See application file for complete search history.

(56) References Cited

U.S. PATENT DOCUMENTS

| 2017/0272009 | A1* | 9/2017 | Kawamura | ................ B60L 3/12 |
| 2017/0291640 | A1* | 10/2017 | Fujita | ..................... B62D 5/049 |
| 2018/0178835 | A1 | 6/2018 | Toko | |
| 2018/0229761 | A1* | 8/2018 | Fujita | ..................... B62D 5/046 |

FOREIGN PATENT DOCUMENTS

| EP | 3342678 A1 | 7/2018 |
| JP | 2018-103899 A | 7/2018 |

OTHER PUBLICATIONS

Apr. 17, 2020 Extended European Search Report issued in European Patent Application No. 19206874.0.

* cited by examiner

*Primary Examiner* — Muhammad S Islam
(74) *Attorney, Agent, or Firm* — Oliff PLC

(57) ABSTRACT

A first microcomputer is configured to identify the cause (a content of the abnormality) of a communication abnormality based on a combination of whether communication through a first communication line is established, whether communication through a second communication line is established, and whether a second clock is normal. Specifically, the first microcomputer separately determines whether the communication abnormality between the first microcomputer and a second microcomputer is simply due to an abnormality in the first communication line and the second communication line, or due to stop of a function of the second microcomputer. The second microcomputer is configured to identify the cause of the communication abnormality based on a combination of whether the communication through the first communication line is established, whether the communication through the second communication line is established, and whether a first clock is normal.

4 Claims, 5 Drawing Sheets

| CONTENT OF ABNORMALITY | DETERMINATION CONDITION | OPERATION STATE OF FIRST CONTROL UNIT 20 | OPERATION STATE OF SECOND CONTROL UNIT 30 |
|---|---|---|---|
| (A) FUNCTION STOP OF SECOND MICRO-COMPUTER 31 | ALL OF THE FOLLOWING DETERMINATION CONDITIONS ARE SATISFIED SIMULTANEOUSLY | OPERATING NORMALLY | STOPPED |
| | A1: COMMUNICATION THROUGH FIRST COMMUNICATION LINE 41 IS NOT ESTABLISHED | | |
| | A2: COMMUNICATION THROUGH SECOND COMMUNICATION LINE 42 IS NOT ESTABLISHED | | |
| | A3: AN ABNORMALITY HAS OCCURRED IN SECOND SIGNAL LINE 44 (SECOND CLOCK $S_{CL2}$) | | |
| (B) ABNORMALITY IN SECOND SIGNAL LINE 44 (INCLUDING OPEN FAILURE) | ALL OF THE FOLLOWING DETERMINATION CONDITIONS ARE SATISFIED SIMULTANEOUSLY | STOPPED | OPERATING NORMALLY |
| | B1: AT LEAST ONE OF COMMUNICATION THROUGH FIRST COMMUNICATION LINE 41 AND COMMUNICATION THROUGH SECOND COMMUNICATION LINE 42 IS ESTABLISHED | | |
| | B2: AN ABNORMALITY HAS OCCURRED IN SECOND SIGNAL LINE 44 (SECOND CLOCK $S_{CL2}$) | | |
| (C) FIRST COMMUNICATION ABNORMALITY (ABNORMALITY IN BOTH FIRST COMMUNICATION LINE 41 AND SECOND COMMUNICATION LINE 42) | ALL OF THE FOLLOWING DETERMINATION CONDITIONS ARE SATISFIED SIMULTANEOUSLY | OPERATING NORMALLY | STOPPED |
| | C1: COMMUNICATION THROUGH FIRST COMMUNICATION LINE 41 IS NOT ESTABLISHED | | |
| | C2: COMMUNICATION THROUGH SECOND COMMUNICATION LINE 42 IS NOT ESTABLISHED | | |
| | C3: SECOND SIGNAL LINE 44 IS NORMAL (SECOND CLOCK $S_{CL2}$) | | |

FIG. 2

| CONTENT OF ABNORMALITY | DETERMINATION CONDITION | | OPERATION STATE OF FIRST CONTROL UNIT 20 | OPERATION STATE OF SECOND CONTROL UNIT 30 |
|---|---|---|---|---|
| (A) FUNCTION STOP OF SECOND MICRO-COMPUTER 31 | ALL OF THE FOLLOWING DETERMINATION CONDITIONS ARE SATISFIED SIMULTANEOUSLY | A1: COMMUNICATION THROUGH FIRST COMMUNICATION LINE 41 IS NOT ESTABLISHED<br>A2: COMMUNICATION THROUGH SECOND COMMUNICATION LINE 42 IS NOT ESTABLISHED<br>A3: AN ABNORMALITY HAS OCCURRED IN SECOND SIGNAL LINE 44 (SECOND CLOCK $S_{CL2}$) | OPERATING NORMALLY | STOPPED |
| (B) ABNORMALITY IN SECOND SIGNAL LINE 44 (INCLUDING OPEN FAILURE) | ALL OF THE FOLLOWING DETERMINATION CONDITIONS ARE SATISFIED SIMULTANEOUSLY | B1: AT LEAST ONE OF COMMUNICATION THROUGH FIRST COMMUNICATION LINE 41 AND COMMUNICATION THROUGH SECOND COMMUNICATION LINE 42 IS ESTABLISHED<br>B2: AN ABNORMALITY HAS OCCURRED IN SECOND SIGNAL LINE 44 (SECOND CLOCK $S_{CL2}$) | STOPPED | OPERATING NORMALLY |
| (C) FIRST COMMUNICATION ABNORMALITY (ABNORMALITY IN BOTH FIRST COMMUNICATION LINE 41 AND SECOND COMMUNICATION LINE 42) | ALL OF THE FOLLOWING DETERMINATION CONDITIONS ARE SATISFIED SIMULTANEOUSLY | C1: COMMUNICATION THROUGH FIRST COMMUNICATION LINE 41 IS NOT ESTABLISHED<br>C2: COMMUNICATION THROUGH SECOND COMMUNICATION LINE 42 IS NOT ESTABLISHED<br>C3: SECOND SIGNAL LINE 44 IS NORMAL (SECOND CLOCK $S_{CL2}$) | OPERATING NORMALLY | STOPPED |

FIG. 3

| CONTENT OF ABNORMALITY | DETERMINATION CONDITION | | OPERATION STATE OF FIRST CONTROL UNIT 20 | OPERATION STATE OF SECOND CONTROL UNIT 30 |
|---|---|---|---|---|
| (D) SECOND COMMUNICATION ABNORMALITY (ABNORMALITY IN SECOND COMMUNICATION LINE 42) | ALL OF THE FOLLOWING DETERMINATION CONDITIONS ARE SATISFIED SIMULTANEOUSLY | D1: COMMUNICATION THROUGH FIRST COMMUNICATION LINE 41 IS ESTABLISHED<br>D2: COMMUNICATION THROUGH SECOND COMMUNICATION LINE 42 IS NOT ESTABLISHED<br>D3: SECOND SIGNAL LINE 44 IS NORMAL (SECOND CLOCK $S_{CL2}$) | STOPPED | OPERATING NORMALLY |
| (E) THIRD COMMUNICATION ABNORMALITY (ABNORMALITY IN FIRST COMMUNICATION LINE 41) | ALL OF THE FOLLOWING DETERMINATION CONDITIONS ARE SATISFIED SIMULTANEOUSLY | E1: COMMUNICATION THROUGH FIRST COMMUNICATION LINE 41 IS NOT ESTABLISHED<br>E2: COMMUNICATION THROUGH SECOND COMMUNICATION LINE 42 IS ESTABLISHED<br>E3: SECOND SIGNAL LINE 44 IS NORMAL (SECOND CLOCK $S_{CL2}$) | OPERATING NORMALLY | STOPPED |

FIG. 4

| CONTENT OF ABNORMALITY | DETERMINATION CONDITION | OPERATION STATE OF FIRST CONTROL UNIT 20 | OPERATION STATE OF SECOND CONTROL UNIT 30 |
|---|---|---|---|
| (F) FUNCTION STOP OF FIRST MICRO-COMPUTER 21 | ALL OF THE FOLLOWING DETERMINATION CONDITIONS ARE SATISFIED SIMULTANEOUSLY<br>F1: COMMUNICATION THROUGH FIRST COMMUNICATION LINE 41 IS NOT ESTABLISHED<br>F2: COMMUNICATION THROUGH SECOND COMMUNICATION LINE 42 IS NOT ESTABLISHED<br>F3: AN ABNORMALITY HAS OCCURRED IN FIRST SIGNAL LINE 43 (FIRST CLOCK $S_{CL1}$) | STOPPED | OPERATING NORMALLY |
| (G) ABNORMALITY IN FIRST SIGNAL LINE 43 (INCLUDING OPEN FAILURE) | ALL OF THE FOLLOWING DETERMINATION CONDITIONS ARE SATISFIED SIMULTANEOUSLY<br>G1: AT LEAST ONE OF COMMUNICATION THROUGH FIRST COMMUNICATION LINE 41 AND COMMUNICATION THROUGH SECOND COMMUNICATION LINE 42 IS ESTABLISHED<br>G2: AN ABNORMALITY HAS OCCURRED IN FIRST SIGNAL LINE 43 (FIRST CLOCK $S_{CL1}$) | OPERATING NORMALLY | STOPPED |
| (H) FIRST COMMUNICATION ABNORMALITY (ABNORMALITY IN BOTH FIRST COMMUNICATION LINE 41 AND SECOND COMMUNICATION LINE 42) | ALL OF THE FOLLOWING DETERMINATION CONDITIONS ARE SATISFIED SIMULTANEOUSLY<br>H1: COMMUNICATION THROUGH FIRST COMMUNICATION LINE 41 IS NOT ESTABLISHED<br>H2: COMMUNICATION THROUGH SECOND COMMUNICATION LINE 42 IS NOT ESTABLISHED<br>H3: FIRST SIGNAL LINE 43 IS NORMAL (FIRST CLOCK $S_{CL1}$) | OPERATING NORMALLY | STOPPED |

FIG. 5

| CONTENT OF ABNORMALITY | DETERMINATION CONDITION | | OPERATION STATE OF FIRST CONTROL UNIT 20 | OPERATION STATE OF SECOND CONTROL UNIT 30 |
|---|---|---|---|---|
| (I) SECOND COMMUNICATION ABNORMALITY (ABNORMALITY IN SECOND COMMUNICATION LINE 42) | ALL OF THE FOLLOWING DETERMINATION CONDITIONS ARE SATISFIED SIMULTANEOUSLY | I1: COMMUNICATION THROUGH FIRST COMMUNICATION LINE 41 IS ESTABLISHED<br>I2: COMMUNICATION THROUGH SECOND COMMUNICATION LINE 42 IS NOT ESTABLISHED<br>I3: FIRST SIGNAL LINE 43 IS NORMAL (FIRST CLOCK $S_{CL1}$) | STOPPED | OPERATING NORMALLY |
| (J) THIRD COMMUNICATION ABNORMALITY (ABNORMALITY IN FIRST COMMUNICATION LINE 41) | ALL OF THE FOLLOWING DETERMINATION CONDITIONS ARE SATISFIED SIMULTANEOUSLY | J1: COMMUNICATION THROUGH FIRST COMMUNICATION LINE 41 IS NOT ESTABLISHED<br>J2: COMMUNICATION THROUGH SECOND COMMUNICATION LINE 42 IS ESTABLISHED<br>J3: FIRST SIGNAL LINE 43 IS NORMAL (FIRST CLOCK $S_{CL1}$) | OPERATING NORMALLY | STOPPED | ial
MOTOR CONTROL DEVICE

INCORPORATION BY REFERENCE

The disclosure of Japanese Patent Application No. 2018-208146 filed on Nov. 5, 2018 including the specification, drawings and abstract is incorporated herein by reference in its entirety.

BACKGROUND OF THE INVENTION

1. Field of the Invention

The present invention relates to a motor control device.

2. Description of Related Art

Hitherto, there is known a control device that controls a motor serving as a generation source of an assist torque applied to a steering mechanism of a vehicle. For example, a control device described in Japanese Unexamined Patent Application Publication No. 2018-103899 (JP 2018-103899 A) controls power supply to a motor having windings of two systems. The control device has two sets of drive circuits and two sets of control systems each corresponding to the two windings. Each of the control systems independently controls power supply to a corresponding one of the windings of the two systems by controlling a corresponding one of the drive circuits.

The control system of each system has a microcomputer. One of the microcomputers of the two systems functions as a master and the other functions as a slave. The microcomputers of the two systems transmit and receive information indicating an abnormality in their own systems. When the abnormality occurs in the microcomputer that functions as the master, the microcomputer that has functioned as the slave functions as the master.

In the control device described in JP 2018-103899 A, there is a concern that a first microcomputer and a second microcomputer may detect these abnormalities as the same abnormalities, although their causes are different. For example, the first microcomputer detects an abnormality as a communication abnormality between the first microcomputer and the second microcomputer both when the second microcomputer stops functioning and when communication between the first microcomputer and the second microcomputer is not established. Further, the second microcomputer detects an abnormality as a communication abnormality between the second microcomputer and the first microcomputer both when the first microcomputer stops functioning and when communication between the second microcomputer and the first microcomputer is not established. This is because communication between the first microcomputer and the second microcomputer is not established when the first microcomputer or the second microcomputer stops functioning. Thus, the first microcomputer and the second microcomputer may not be able to identify the cause of the communication abnormality.

SUMMARY OF THE INVENTION

An object of the present invention is to provide a motor control device that can identify the cause of the communication abnormality that may occur between a plurality of control circuits.

A first aspect of the present invention includes: a plurality of control circuits configured to control power supply to a plurality of winding groups of a plurality of systems in a motor, the power supply being controlled independently for each of the systems and the number of the control circuits being the same as the number of the systems; a communication line configured to transmit and receive, between the control circuits, a state signal that indicates a state of each of the systems and that is generated by each of the control circuits; and a signal line configured to transmit and receive, between the control circuits, a periodic pulse signal that indicates normal operation of each of the control circuits and that is generated by each of the control circuits. Each of the control circuits determines whether an abnormality has occurred in communication through the communication line or whether a function of the control circuit of another system is stopped, based on a combination of whether the communication through the communication line is established and whether the periodic pulse signal of the other system, which is acquired through the signal line, is established.

In either cases where the communication through the communication line is not established and the function of the communication circuit of the other system stops, the communication between the control circuit and the control circuit of the other system is in an abnormal state. However, according to the above configuration, it is possible to identify the cause of the communication abnormality between the plurality of control circuits. For example, even when the communication through the communication line is not established, when the periodic pulse signal of the other system is normal, it can be considered that the control circuit of the other system is operating. Hence, it is understood that the control circuit of the other system is not in a stopped state but an abnormality has occurred in the communication through the communication line. Thus, the control circuits can separately determine whether an abnormality has occurred in the communication through the communication line or whether the function of the control circuit of the other system is stopped, based on the combination of whether the communication through the communication line is established and whether the periodic pulse signal of the other system acquired through the signal line is normal.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein:

FIG. 2 AND FIG. 3 is a table showing abnormality determination conditions of a first microcomputer, contents of abnormalities serving as determination results, operation states of a first control unit, and operation states of a second control unit in the embodiment; and FIG. 4 AND FIG. 5 is a table showing abnormality determination conditions of a second microcomputer, the contents of the abnormalities serving as the determination results, the operation states of the first control unit, and the operation states of the second control unit in the embodiment.

DETAILED DESCRIPTION OF EMBODIMENTS

Figure 1:
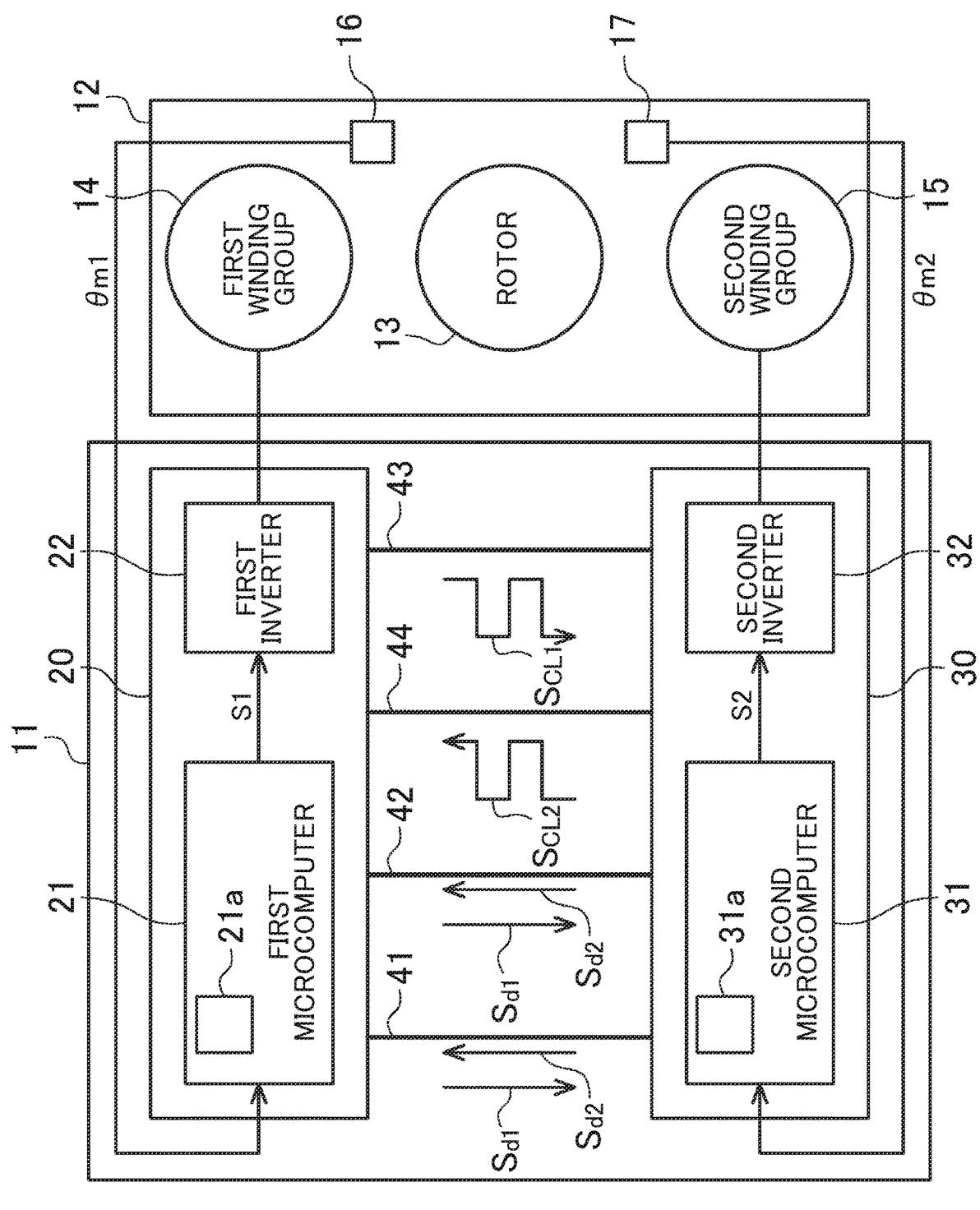
FIG. 1 is a block diagram showing an embodiment of a motor control device.

Hereinafter, an embodiment of a motor control device of the present invention will be described. As shown in FIG. 1, an electronic control unit (ECU) 11 serving as the motor control device controls driving of a motor 12. The motor 12 is a three-phase brushless motor. The motor 12 includes a rotor 13, a first winding group 14, a second winding group 15, a first rotation angle sensor 16, and a second rotation angle sensor 17. Each of the first winding group 14 and the second winding group 15 has a U-phase coil, a V-phase coil, and a W-phase coil. The first rotation angle sensor 16 and the second rotation angle sensor 17 detect rotation angles θm1 and θm2 of the motor 12 (rotor 13), respectively.

The ECU 11 and the motor 12 (the first winding group 14 and the second winding group 15) are connected to each other by bus bars or cables. The ECU 11 controls power supply to the first winding group 14 and the second winding group 15 with separate systems. The ECU 11 includes a first control unit 20 that controls power supply to the first winding group 14 and a second control unit 30 that controls power supply to the second winding group 15.

The first control unit 20 has a first microcomputer 21 serving as a control circuit and a first inverter 22. The first microcomputer 21 has a first clock generation unit 21a. The first clock generation unit 21a generates a first clock $S_{CL1}$ based on a clock having a fundamental frequency read from a crystal oscillator (not shown) provided in the ECU 11. The first clock $S_{CL1}$ is a clock signal for defining an operation timing for each part (a central processing unit (CPU) and its peripheral circuits) of the first microcomputer 21. The first clock $S_{CL1}$ is also a periodic pulse signal indicating that the first microcomputer 21 is operating normally. The first clock $S_{CL1}$ alternately repeats a high level voltage and a low level voltage at a constant period.

The first microcomputer 21 calculates a first current command value that is a target value of a current to be supplied to the first winding group 14. The first current command value is set to a value of half (50%) of an amount of current required for the first winding group 14 to generate half of a total generated torque required of the motor 12. The first microcomputer 21 generates a command signal S1 (pulse width modulation (PWM) signal) for the first inverter 22 by executing current feedback control for causing a value of an actual current supplied to the first winding group 14 to follow the first current command value. The first microcomputer 21 uses the rotation angle θm1 of the motor 12 (rotor 13) detected through the first rotation angle sensor 16 to control energization to the first winding group 14.

The first inverter 22 is a PWM three-phase inverter and converts a direct current (DC) power supplied from a DC power source to a three-phase alternating current (AC) power with a switching element for each phase to execute switching based on the command signal S1 generated by the first microcomputer 21. A current corresponding to the command signal S1 is supplied to the first winding group 14 through the first inverter 22.

The second control unit 30 basically has the same configuration as the first control unit 20. That is, the second control unit 30 has a second microcomputer 31 serving as a control circuit and a second inverter 32.

The second microcomputer 31 has a second clock generation unit 31a. The second clock generation unit 31a generates a second clock $S_{CL2}$ based on a clock having a fundamental frequency read from a crystal oscillator (not shown) provided in the ECU 11. The second clock $S_{CL2}$ is a clock signal for defining an operation timing for each part (a CPU and its peripheral circuits) of the second microcomputer 31. The second clock $S_{CL2}$ is also a periodic pulse signal indicating that the second microcomputer 31 is operating normally.

The second microcomputer 31 calculates a second current command value that is a target value of a current to be supplied to the second winding group 15. The second current command value is set to a value of half (50%) of an amount of current required for the second winding group 15 to generate half of a total generated torque required of the motor 12. The second microcomputer 31 generates a command signal S2 (PWM signal) for the second inverter 32 by executing current feedback control for causing a value of an actual current supplied to the second winding group 15 to follow the second current command value. The second microcomputer 31 uses the rotation angle θm2 of the motor 12 (rotor 13) detected through the second rotation angle sensor 17 to control energization to the second winding group 15. A current corresponding to the command signal S2 is supplied to the second winding group 15 through the second inverter 32.

The first microcomputer 21 and the second microcomputer 31 transmit and receive digital signals to and from each other through a first communication line 41 and a second communication line 42. For example, a serial peripheral interface (SPI) that is a type of a standard for synchronous serial communication is employed as a standard of communication between the first microcomputer 21 and the second microcomputer 31 through the first communication line 41 and the second communication line 42. The first microcomputer 21 and the second microcomputer 31 have functions of detecting an abnormality in themselves and in the systems to which the first microcomputer 21 and the second microcomputer 31 respectively belong.

The first microcomputer 21 generates a first state signal $S_{d1}$ indicating a state of a first system to which the first microcomputer 21 belongs as a digital signal, and supplies the generated first state signal $S_{d1}$ to the second microcomputer 31 through the first communication line 41 and the second communication line 42. The first state signal $S_{d1}$ includes an abnormality occurrence state of the first system, an operation state of the first system, and torque generated by the first winding group 14. The abnormality occurrence state of the first system includes, for example, whether there is an abnormality in the first microcomputer 21, the first inverter 22, and the first rotation angle sensor 16. The operation state of the first system includes a state in which the first microcomputer 21 can execute power supply control for the first winding group 14 and a state in which the first microcomputer 21 cannot execute the power supply control for the first winding group 14 due to factors such as a decrease in a power supply voltage. The generated torque refers to a degree of torque generated by the first winding group 14 and corresponds to the current command value that is the target value of the current to be supplied to the first winding group 14.

As with the first microcomputer 21, the second microcomputer 31 generates a second state signal $S_{d2}$ indicating a state of a second system to which the second microcomputer 31 belongs as a digital signal, and supplies the generated second state signal $S_{d2}$ to the first microcomputer 21 through the first communication line 41 and the second communication line 42.

When the first microcomputer 21 determines, through the second state signal $S_{d2}$, that the power supply control for the second winding group 15 cannot be executed by the second system, a first power supply control or a second power supply control is executed for the first winding group 14. The first power supply control is a power supply control in a normal state in which two-system drive is executed, and refers to a power supply control in which half of the total generated torque required of the motor 12 is covered by the torque generated by the first winding group 14. The second power supply control refers to a power supply control in which the total generated torque required of the motor 12 is covered by the torque generated by the first winding group 14. When the second power supply control is executed, the current command value for the first winding group 14 is set to a value twice as large as that during the power supply control in the normal state in which the two-system drive is executed.

When the second microcomputer 31 determines, through the first state signal $S_{d1}$, that the power supply control for the first winding group 14 cannot be executed by the first system, the first power supply control or the second power supply control is executed for the second winding group 15 as with the first microcomputer 21.

In this manner, by independently controlling the power supply to the two winding groups of the two systems in the motor 12, even if an abnormality occurs in the first system, the motor 12 can be continuously rotated through the power supply to the winding group of the second system.

The first microcomputer 21 and the second microcomputer 31 transmit and receive the first clock $S_{CL1}$ and the second clock $S_{CL2}$ to and from each other through a first signal line 43 and a second signal line 44. The first microcomputer 21 and the second microcomputer 31 monitor each other based on the first state signal $S_{d1}$, the second state signal $S_{d2}$, the first clock $S_{CL1}$, and the second clock $S_m$. Here, when one of the first microcomputer 21 and the second microcomputer 31 stops functioning, the first clock $S_{CL1}$ or the second clock $S_{CL2}$ generated by the microcomputer that stopped functioning indicates an abnormality. Simultaneously, all communication through the first communication line 41 and the second communication line 42 is interrupted. Based on the above, the first microcomputer 21 determines whether a simple communication abnormality has occurred between the first microcomputer 21 and the second microcomputer 31, or the function of the second microcomputer 31 has stopped. Similarly, the second microcomputer 31 determines whether a simple communication abnormality has occurred between the first microcomputer 21 and the second microcomputer 31, or the function of the first microcomputer 21 has stopped.

As shown in FIG. 2 AND FIG. 3, the first microcomputer 21 detects the following abnormalities (A) to (E).
(A) Function stop of the second microcomputer 31
(B) Abnormality in the second signal line 44 (including open failure)
(C) First communication abnormality (abnormality in both the first communication line 41 and the second communication line 42)
(D) Second communication abnormality (abnormality in the second communication line 42)
(E) Third communication abnormality (abnormality in the first communication line 41) Specific detection methods for the abnormalities (A) to (E) are as follows.
<Abnormality (A)>
The first microcomputer 21 determines that the function of the second microcomputer 31 is stopped when all of the following determination conditions (A1) to (A3) are satisfied simultaneously.
(A1) The communication through the first communication line 41 is not established.
(A2) The communication through the second communication line 42 is not established.
(A3) An abnormality has occurred in the second clock $S_{CL2}$ (including a case in which the second clock $S_{CL2}$ cannot be acquired).

When both of the communication through the first communication line 41 and the communication through the second communication line 42 are not established and an abnormality has occurred in the second clock $S_{CL2}$, it is highly probable that the function of the second microcomputer 31 has stopped. Thus, the power supply control for the motor 12 (first winding group 14) is executed only by the first microcomputer 21 that is operating normally. That is, in the ECU 11, while the second control unit 30 including the second microcomputer 31 stops its operation, the first control unit 20 including the first microcomputer 21 continues its normal operation.
<Abnormality (B)>
The first microcomputer 21 determines that an abnormality has occurred in the second signal line 44 when both of the following determination conditions (B1) and (B2) are satisfied simultaneously.
(B1) At least one of the communication through the first communication line 41 and the communication through the second communication line 42 is established.
(B2) An abnormality has occurred in the second clock $S_{CL2}$ (including a case in which the second clock $S_{CL2}$ cannot be acquired).

When the function of the second microcomputer 31 is stopped, both of the communication through the first communication line 41 and the communication through the second communication line 42 are not established. Thus, when at least one of the communication through the first communication line 41 and the communication through the second communication line 42 is established, the second microcomputer 31 is not in a stopped state but in an operating state. Therefore, when an abnormality has occurred in the second clock $S_{CL2}$ although at least one of the communication through the first communication line 41 and the communication through the second communication line 42 is established, it is highly probable that an abnormality has occurred in the second signal line 44. When an abnormal state of the second clock $S_{CL2}$ is a state where the second clock $S_{CL2}$ cannot be acquired, for example, an open failure (disconnection) may have occurred in the second signal line 44.

Upon determining that an abnormality has occurred in the second signal line 44, the first microcomputer 21 stops its own operation. This is because, after an abnormality has occurred in the second clock $S_{CL2}$ (including the case in which the second clock $S_{CL2}$ cannot be acquired), the first microcomputer 21 cannot determine whether a simple communication abnormality has occurred between the first microcomputer 21 and the second microcomputer 31, or whether the function of the microcomputer 31 has stopped. Accordingly, when an abnormality occurs in the second signal line 44, the power supply control for the motor 12 (second winding group 15) is executed only by the second microcomputer 31. That is, in the ECU 11, while the first control unit 20 including the first microcomputer 21 stops its operation, the second control unit 30 including the second microcomputer 31 continues its normal operation.
<Abnormality (C)>
The first microcomputer 21 determines that the first communication abnormality has occurred when all of the following determination conditions (C1) to (C3) are satisfied simultaneously. The first communication abnormality refers to a state where an abnormality has occurred in both the first communication line 41 and the second communication line 42.

(C1) The communication through the first communication line 41 is not established.
(C2) The communication through the second communication line 42 is not established.
(C3) The second clock $S_{CL2}$ is normal.

Even when both the communication through the first communication line 41 and the communication through the second communication line 42 are not established, when the second clock $S_{CL2}$ is normal, an abnormality has occurred only in the first communication line 41 and the second communication line 42, and the second microcomputer 31 is operating normally. However, although depending on product specifications and the like, when the first communication abnormality occurs, the first microcomputer 21 is operated with priority over the second microcomputer 31. Therefore, when the first communication abnormality occurs, the power supply control for the motor 12 (first winding group 14) is executed only by the first microcomputer 21 that is operating normally. That is, in the ECU 11, while the first control unit 20 including the first microcomputer 21 continues its normal operation, the second control unit 30 including the second microcomputer 31 stops its operation.

Depending on the product specifications and the like, a configuration in which the second microcomputer 31 is operated with priority over the first microcomputer 21 when the first communication abnormality occurs may be employed. In this case, when the first communication abnormality occurs, the power supply control for the motor 12 (second winding group 15) is executed only by the second microcomputer 31.

<Abnormality (D)>
The first microcomputer 21 determines that the second communication abnormality has occurred when all of the following determination conditions (D1) to (D3) are satisfied simultaneously. The second communication abnormality refers to a state where an abnormality has occurred in the second communication line 42.

(D1) The communication through the first communication line 41 is established.
(D2) The communication through the second communication line 42 is not established.
(D3) The second clock $S_{CL2}$ is normal.

Even when communication through the second communication line 42 is not established, since communication through the first communication line 41 is established and the second clock $S_{CL2}$ is normal, the second microcomputer 31 is operating normally. However, the first microcomputer 21 stops its own operation upon determining that the second communication abnormality has occurred. This is because the first microcomputer 21 cannot acquire the second state signal $S_{d2}$ after an abnormality has occurred in the second communication line 42. Therefore, when the second communication abnormality occurs, the power supply control for the motor 12 (second winding group 15) is executed only by the second microcomputer 31 that is operating normally. That is, in the ECU 11, while the first control unit 20 including the first microcomputer 21 stops its operation, the second control unit 30 including the second microcomputer 31 continues its normal operation.

<Abnormality (E)>
The first microcomputer 21 determines that the third communication abnormality has occurred when all of the following determination conditions (E1) to (E3) are satisfied simultaneously. The third communication abnormality refers to a state where an abnormality has occurred in the first communication line 41.

(E1) The communication through the first communication line 41 is not established.
(E2) The communication through the second communication line 42 is established.
(E3) The second clock $S_{CL2}$ is normal.

Even when communication through the first communication line 41 is not established, since communication through the second communication line 42 is established and the second clock $S_{CL2}$ is normal, the second microcomputer 31 is operating normally. As will be described later, the second microcomputer 31 also has an abnormality detection function similar to that of the first microcomputer 21. The second microcomputer 31 stops its own operation upon determining that the third communication abnormality has occurred. This is because the second microcomputer 31 cannot acquire the first state signal $S_{d1}$ after an abnormality has occurred in the first communication line 41. Therefore, when the third communication abnormality occurs, the power supply control for the motor 12 (first winding group 14) is executed only by the first microcomputer 21 that is operating normally. That is, in the ECU 11, while the first control unit 20 including the first microcomputer 21 continues its normal operation, the second control unit 30 including the second microcomputer 31 stops its operation.

As shown in FIG. 4 AND FIG. 5, the second microcomputer 31 detects the following abnormalities (F) to (J).

(F) Function stop of the first microcomputer 21
(G) Abnormality in the first signal line 43 (including open failure)
(H) First communication abnormality (abnormality in both the first communication line 41 and the second communication line 42)
(I) Second communication abnormality (abnormality in the second communication line 42)
(J) Third communication abnormality (abnormality in the first communication line 41)

Specific detection methods for abnormalities (F) to (J) are as follows.

<Abnormality (F)>
The second microcomputer 31 determines that the function of the first microcomputer 21 is stopped when all of the following determination conditions (F1) to (F3) are satisfied simultaneously.

(F1) The communication through the first communication line 41 is not established.
(F2) The communication through the second communication line 42 is not established.
(F3) An abnormality has occurred in the first clock $S_{CL1}$ (including a case in which the first clock $S_{CL1}$ cannot be acquired).

When both the communication through the first communication line 41 and the communication through the second communication line 42 are not established and an abnormality has occurred in the first clock $S_{CL1}$, it is highly probable that the function of the first microcomputer 21 has stopped. For this reason, the power supply control for the motor 12 (second winding group 15) is executed only by the second microcomputer 31 that is operating normally. That is, in the ECU 11, while the first control unit 20 including the first microcomputer 21 stops its operation, the second control unit 30 including the second microcomputer 31 continues its normal operation.

<Abnormality (G)>
The second microcomputer 31 determines that an abnormality has occurred in the first signal line 43 when both of the following determination conditions (G1) and (G2) are satisfied simultaneously.
(G1) At least one of the communication through the first communication line 41 and the communication through the second communication line 42 is established.
(G2) An abnormality has occurred in the first clock $S_{CL1}$ (including the case in which the first clock $S_{CL1}$ cannot be acquired).

When the function of the first microcomputer 21 is stopped, both the communication through the first communication line 41 and the communication through the second communication line 42 are not established. Thus, when at least one of the communication through the first communication line 41 and the communication through the second communication line 42 is established, the first microcomputer 21 is not in a stopped state but in an operating state. Therefore, when an abnormality has occurred in the first clock $S_{CL1}$ although at least one of the communication through the first communication line 41 and the communication through the second communication line 42 is established, it is highly probable that an abnormality has occurred in the first signal line 43. When an abnormal state of the first clock $S_{CL1}$ is a state where the first clock $S_{CL1}$ cannot be acquired, for example, an open failure (disconnection) may have occurred in the first signal line 43.

Upon determining that an abnormality has occurred in the first signal line 43, the second microcomputer 31 stops its own operation. This is because, after an abnormality has occurred in the first clock $S_{CL1}$ (including the case in which the first clock $S_{CL1}$ cannot be acquired), the second microcomputer 31 cannot determine whether a simple communication abnormality has occurred between the first microcomputer 21 and the second microcomputer 31, or whether the function of the first microcomputer 21 has stopped. Therefore, when an abnormality occurs in the first signal line 43, the power supply control for the motor 12 (first winding group 14) is executed only by the first microcomputer 21. That is, in the ECU 11, while the first control unit 20 including the first microcomputer 21 continues its normal operation, the second control unit 30 including the second microcomputer 31 stops its operation.

<Abnormality (H)>
The second microcomputer 31 determines that the first communication abnormality has occurred when all of the following determination conditions (H1) to (H3) are satisfied simultaneously. The first communication abnormality refers to a state where an abnormality has occurred in both the first communication line 41 and the second communication line 42.
(H1) The communication through the first communication line 41 is not established.
(H2) The communication through the second communication line 42 is not established.
(H3) The first clock $S_{CL1}$ is normal.

Even when both the communication through the first communication line 41 and the communication through the second communication line 42 are not established, when the first clock $S_{CL1}$ is normal, an abnormality has occurred only in the first communication line 41 and the second communication line 42, and the first microcomputer 21 is operating normally. However, although depending on the product specifications and the like, when the first communication abnormality occurs, the first microcomputer 21 is operated with priority over the second microcomputer 31. Thus, the second microcomputer 31 stops its own operation upon determining that the first communication abnormality has occurred. Therefore, when the first communication abnormality occurs, the power supply control for the motor 12 (first winding group 14) is executed only by the first microcomputer 21 that is operating normally. That is, in the ECU 11, while the first control unit 20 including the first microcomputer 21 continues its normal operation, the second control unit 30 including the second microcomputer 31 stops its operation.

Depending on the product specifications and the like, a configuration in which the second microcomputer 31 is operated with priority over the first microcomputer 21 when the first communication abnormality occurs may be employed. In this case, when the first communication abnormality occurs, the power supply control for the motor 12 (second winding group 15) is executed only by the second microcomputer 31.

<Abnormality (I)>
The second microcomputer 31 determines that the second communication abnormality has occurred when all of the following determination conditions (I1) to (I3) are satisfied simultaneously. The second communication abnormality refers to a state where an abnormality has occurred in the second communication line 42.
(I1) The communication through the first communication line 41 is established.
(I2) The communication through the second communication line 42 is not established.
(I3) The first clock $S_{CL1}$ is normal.

Even when communication through the second communication line 42 is not established, since communication through the first communication line 41 is established and the first clock $S_{CL1}$ is normal, the first microcomputer 21 is operating normally. However, as described above, the first microcomputer 21 stops its own operation upon determining that the second abnormality has occurred. This is because the first microcomputer 21 cannot acquire the second state signal $S_{d2}$ after an abnormality has occurred in the second communication line 42. Therefore, when the second communication abnormality occurs, the power supply control for the motor 12 (second winding group 15) is executed only by the second microcomputer 31 that is operating normally. That is, in the ECU 11, while the first control unit 20 including the first microcomputer 21 stops its operation, the second control unit 30 including the second microcomputer 31 continues its normal operation.

<Abnormality (J)>
The second microcomputer 31 determines that the third communication abnormality has occurred when all of the following determination conditions (J1) to (J3) are satisfied simultaneously. The third communication abnormality refers to a state where an abnormality has occurred in the first communication line 41.
(J1) The communication through the first communication line 41 is not established.
(J2) The communication through the second communication line 42 is established.
(J3) The first clock $S_{CL1}$ is normal.

Even when communication through the first communication line 41 is not established, since communication through the second communication line 42 is established and the first clock $S_{CL1}$ is normal, the first microcomputer 21 is operating normally. However, the second microcomputer 31 stops its own operation upon determining that the third communication abnormality has occurred. This is because the second microcomputer 31 cannot acquire the first state signal $S_{d1}$ after an abnormality has occurred in the first communication line 41. Therefore, when the third communication abnormality occurs, the power supply control for the motor 12 (first winding group 14) is executed only by the first microcomputer 21 that is operating normally. That is, in the ECU 11, while the first control unit 20 including the first microcomputer 21 continues its normal operation, the second control unit 30 including the second microcomputer 31 stops its operation.

According to the present embodiment, the following effects can be obtained.

(1) The first microcomputer 21 can identify a cause (a content of the abnormality) of the communication abnormality based on a combination of whether communication through the first communication line 41 is established, whether communication through the second communication line 42 is established, and whether the second clock $S_{CL2}$ is normal. Specifically, the first microcomputer 21 can separately determine whether the communication abnormality between the first microcomputer 21 and the second microcomputer 31 is simply due to the abnormality in the first communication line 41 and the second communication line 42, or is due to the stop of the function of the second microcomputer 31. As with the first microcomputer 21, the second microcomputer 31 can also identify the cause (the content of the abnormality) of the communication abnormality based on a combination of whether communication through the first communication line 41 is established, whether communication through the second communication line 42 is established, and whether the first clock $S_{CL1}$ is normal. Specifically, the second microcomputer 31 can separately determine whether the communication abnormality between the first microcomputer 21 and the second microcomputer 31 is simply due to the abnormality in the first communication line 41 and the second communication line 42, or is due to the stop of the function of the first microcomputer 21. Accordingly, the first microcomputer 21 and the second microcomputer 31 can identify the cause of the communication abnormality in each other.

Whether communication through the communication lines (41, 42) is established refers to a determination result of whether signals are correctly transmitted and received through the communication lines. Possible causes of unestablishment of the communication between the microcomputers (21, 31) include, for example, an abnormality in the microcomputers, an abnormality in the communication lines (disconnection, short circuit), or electromagnetic noise. Whether the clocks ($S_{CL1}$, $S_{CL2}$) are normal refers to a determination result of whether the clocks are correct. For example, if a pulse pattern of the clock shows a predetermined pattern, it is determined that the clock is normal. When the pulse pattern of the clock shows an abnormal pattern that is different from the predetermined pattern, it is determined that an abnormality has occurred in the clock. The abnormality in the clock includes an interruption in the clock. The communication abnormality refers to the state in which, although the microcomputers (21, 31) are operating normally, communication between the microcomputers through the communication lines (transmission and reception of signals) is not performed correctly (communication is not established) due to occurrence of an abnormality such as a disconnection or a short circuit in the communication lines. The function of the microcomputer refers to various roles of the microcomputer, such as a communication function (input/output function) for transmitting and receiving signals to and from an external device, and a calculation function (control function) performed by a central processing unit (CPU). The stop of the function of the microcomputer refers to a state in which at least one operation of the various functions of the microcomputer stops. Depending on a functional part in the microcomputer whose operation is stopped, it is difficult to perform communication (transmission/reception of signals) with the external device. Possible causes for the function of the microcomputer to stop include, for example, a drop in the power supply voltage or noise.

(2) In the ECU 11, the first microcomputer 21 and the second microcomputer 31 can identify the cause of the communication abnormality, that is, the content of the abnormality. Therefore, the ECU 11 is preferably used as a control device for an electric power steering system or a steer-by-wire steering system that requires higher operational reliability. In these cases, the ECU 11 controls an assist motor that serves as a drive source of the electric power steering system, or controls a steering operation motor that serves as a drive source of a steering operation mechanism in the steer-by-wire steering system. As the assist motor or the steering operation motor, a motor having winding groups of a plurality of systems is employed as in the present embodiment. Thus, the first microcomputer 21 and the second microcomputer 31 in the ECU 11 can continue to supply power to the assist motor or the steering operation motor in accordance with the cause of the communication abnormality (the content of the abnormality), and eventually can continue to perform steering assist or turning.

If the first microcomputer 21 and the second microcomputer 31 are both configured to have no function for identifying the cause of the communication abnormality (the content of the abnormality) as described above, the following concerns may arise. That is, it may be considered that the power supply to the motor (the first winding group 14 and the second winding group 15) must be immediately stopped in terms of fail-safe when a communication abnormality is detected from the first microcomputer 21 and the second microcomputer 31.

(3) By independently controlling the power supply to the winding groups (14, 15) of the two systems in the motor 12, even when an abnormality occurs in the first system, the motor 12 can be rotated through the power supply to the winding group in the second system. In this case, if a configuration in which the microcomputer of the system that is operating normally executes the second power supply control (the power supply control in which the total generated torque required of the motor 12 is covered by the torque generated by the winding group of the system that is operating normally) is employed, the following effects can also be obtained. That is, the target value (the first current command value or the second current command value) of the current supplied to the winding group of the system that is operating normally is set to a value twice as large as the value in the normal power supply control in which the two-system drive is executed. Therefore, even when an abnormality occurs in one of the systems, the motor 12 generates a torque of the same magnitude as a total torque generated when the two-system drive is executed. In particular, when the ECU 11 is applied to the electric power steering system or the steer-by-wire steering system, an appropriate steering assist or turning can be continuously performed.

(4) Even when the communication abnormality occurs, the first microcomputer 21 and the second microcomputer 31 may be operating. Under this circumstance, when the first microcomputer 21 and the second microcomputer 31 erroneously determine that the functions of the second microcomputer 31 and the first microcomputer 21 have stopped, respectively, due to a communication abnormality, and when the above-described second power supply control is executed to increase the amount of power supplied to the winding group of its own system in order to cover the torque to be generated by the winding group of the system in which the abnormality has occurred, the following concerns may arise. That is, since the total amount of the current supplied to the motor 12 is larger than the amount of the current to be supplied originally, the motor 12 may generate excessive torque. In particular, when the ECU 11 is applied to the electric power steering system, there is a concern that self-steering occurs.

In this regard, in the present embodiment, the cause of the communication abnormality (the content of the abnormality) can be identified. When the communication of at least one of the first communication line 41 and the second communication line 42 is not established, the microcomputer that cannot acquire the state signals ($S_{d1}$, $S_{d2}$) from the other microcomputer stops its operation. For this reason, even when the microcomputer that can acquire the state signals ($S_{d1}$, $S_{d2}$) from the other microcomputer executes the second power supply control, the total amount of the current supplied to the motor 12 is the same as the amount of the current during normal operation in which the two-system drive is executed. Therefore, the motor 12 does not generate excessive torque. Further, when the ECU 11 is applied to the electric power steering system, the self-steering does not occur.

The embodiment of the present invention may be modified as follows. The ECU 11 according to the present embodiment may be embodied in a control device of a motor used for in-vehicle devices other than the electric power steering system or the steer-by-wire steering system.

In the present embodiment, the first communication line 41 and the second communication line 42 are provided, but three or more communication lines may be provided. In the present embodiment, the power supply to the winding groups (14, 15) of two systems is controlled independently. However, when the motor 12 has winding groups of three or more systems, the power supply to the winding groups of three or more systems may be controlled independently. In this case, the ECU 11 may employ a configuration having the same number of individual control units as the number of systems. The control units of the systems are connected to each other through a plurality of communication lines and a plurality of signal lines.

The signals indicating the normal operation of the first microcomputer 21 and the second microcomputer 31 are not limited to the clocks ($S_{CL1}$, $S_{CL2}$). That is, each of the first microcomputer 21 and the second microcomputer 31 may generate a dedicated periodic pulse signal for monitoring the operation of the other microcomputer. A pulse period of the dedicated periodic pulse signals need not be constant. Further, the pulse pattern of the dedicated periodic pulse signals may be different from that of the clock.

The first microcomputer 21 may determine at least one of the abnormalities (A) to (E) shown in FIG. 2 AND FIG. 3. Further, the second microcomputer 31 may determine at least one of the abnormalities (F) to (J) shown in FIG. 4 AND FIG. 5.

In the present embodiment, the first signal line 43 and the second signal line 44 are provided. Alternatively, a single signal line may be provided to perform bidirectional communication (transmission/reception of the clocks) between the first microcomputer 21 and the second microcomputer 31. Even in this way, the first microcomputer 21 and the second microcomputer 31 can transmit and receive the first clock $S_{CL1}$ and the second clock $S_{CL2}$ to and from each other.

In the present embodiment, the first communication line 41 and the second communication line 42 are provided, but only one of the first communication line 41 and the second communication line 42 may be provided. That is, the first microcomputer 21 and the second microcomputer 31 may perform bidirectional communication (transmission/reception of signals) through the first communication line 41 or the second communication line 42. Even in this way, the first microcomputer 21 can determine the abnormality (A) shown in FIG. 2. Further, the second microcomputer 31 can determine the abnormality (F) shown in FIG. 4.

What is claimed is:

1. A motor control device comprising:
a plurality of control circuits configured to control power supply to a plurality of winding groups of a plurality of systems in a motor, the power supply being controlled independently for each of the systems and the number of the control circuits being the same as the number of the systems;
at least one communication line configured to transmit and receive, between the control circuits, a state signal that indicates a state of each of the systems and that is generated by each of the control circuits; and
at least one signal line configured to transmit and receive, between the control circuits, a periodic pulse signal that indicates normal operation of each of the control circuits and that is generated by each of the control circuits, wherein
each of the control circuits determines whether an abnormality has occurred in communication through the at least one communication line or whether another control circuit of another system has stopped functioning, based on a combination of (i) whether the communication through the at least one communication line is established and (ii) whether the periodic pulse signal of the other system, which is acquired through the at least one signal line, is established, wherein
a first control circuit of the plurality of control circuits determines that the abnormality has occurred in the communication through the at least one communication line in response to determining that (i) a state signal corresponding to a second system of the plurality of systems is not acquired through the at least one communication line and (ii) a periodic pulse signal corresponding to the second system acquired through the at least one signal line is normal.

2. The motor control device according to claim 1, wherein the first control circuit determines that the control circuit of the second system has stopped functioning in response to determining that (i) the state signal corresponding to the second system is not acquired through the at least one communication line and (ii) an abnormality has occurred in the periodic pulse signal corresponding to the second system acquired through the at least one signal line.

3. The motor control device according to claim 1, wherein a plurality of the communication lines and a plurality of the signal lines are provided, and the first control circuit determines that the abnormality has occurred in the communication through any one of the communication lines in response to determining that (i) the state signal corresponding to the second system is not acquired through the communication lines and (ii) the periodic pulse signal corresponding to the second system acquired through the signal lines is normal.

4. The motor control device according to claim 1, wherein a plurality of the communication lines and a plurality of the signal lines are provided, and the first control circuit determines that an abnormality has occurred in the signal lines in response to determining that (i) the state signal corresponding to the second system is acquired and (ii) an abnormality has occurred in the periodic pulse signal corresponding to the second system acquired through the signal lines, the signal lines being configured to transmit the periodic pulse signal indicating the abnormality.

* * * * *